US006486651B1

United States Patent
Lee et al.

(10) Patent No.: US 6,486,651 B1
(45) Date of Patent: Nov. 26, 2002

(54) INTEGRATED CIRCUIT DEVICES HAVING A DELAY LOCKED LOOP THAT IS CONFIGURABLE FOR HIGH-FREQUENCY OPERATION DURING TEST AND METHODS OF OPERATING SAME

(75) Inventors: Jong-soo Lee, Kyungki-do (KR); Kye-hyun Kyung, Kyungki-do (KR); Dae-sun Kim, Kyungki-do (KR); Hyo-jin Oh, Kyungki-do (KR); Sang-chul Kim, Kyungki-do (KR); Tae-seek Son, Kyungki-do (KR)

(73) Assignee: Samsung Electronics Co., Ltd. (KR)

( * ) Notice: Subject to any disclaimer, the term of this patent is extended or adjusted under 35 U.S.C. 154(b) by 52 days.

(21) Appl. No.: 09/721,135

(22) Filed: Nov. 22, 2000

(30) Foreign Application Priority Data

Nov. 23, 1999 (KR) .............................. 99-52224

(51) Int. Cl.[7] .............................. G01R 23/12
(52) U.S. Cl. .................................. 324/76.53
(58) Field of Search .................. 324/76.53, 76.52, 324/76.54, 76.63, 76.68; 327/158, 261, 278; 331/27

(56) References Cited

U.S. PATENT DOCUMENTS 5,675,274 A * 10/1997 Kobayashi et al. ......... 327/158
5,748,043 A *  5/1998 Koslov ....................... 331/1 A
6,069,508 A *  5/2000 Takai ......................... 327/161
6,232,813 B1 * 5/2001 Lee ............................ 327/278

* cited by examiner

Primary Examiner—N. Le
Assistant Examiner—Etienne P LeRoux
(74) Attorney, Agent, or Firm—Myers Bigel Sibley & Sajovec

(57) ABSTRACT

Integrated circuit devices and methods of operating same include a delayed locked loop (DLL) circuit that can be operated at a high frequency during a normal operation mode and during a test mode. The test mode may be, for example, for performing burn-in testing. For example, an integrated circuit device may include a DLL control circuit that generates a control signal that is responsive to a test mode signal. An oscillator circuit may generate a clock signal that is responsive to the test mode signal. This clock signal may be a high frequency clock signal, such as that used to drive a DLL circuit during a normal operation mode. A DLL circuit, which is responsive to the clock signal, may be configured to operate in either a test mode or a normal operation mode based on the control signal. By generating the clock signal at a high frequency, the DLL circuit may be evaluated during burn-in testing, for example, under conditions that are comparable to conditions during normal operation.

19 Claims, 7 Drawing Sheets

INTEGRATED CIRCUIT DEVICES HAVING A DELAY LOCKED LOOP THAT IS CONFIGURABLE FOR HIGH-FREQUENCY OPERATION DURING TEST AND METHODS OF OPERATING SAME

RELATED APPLICATION

This application claims the benefit of Korean Patent Application No. 99-52224, filed Nov. 23, 1999, the disclosure of which is hereby incorporated herein by reference.

FIELD OF THE INVENTION

The present invention relates generally to integrated circuit devices and, more particularly, to integrated circuit devices having a delay locked loop (DLL).

BACKGROUND OF THE INVENTION

The demand for integrated circuit memory devices of increasing integration densities is generally increasing. To meet this demand, integrated circuit memory devices that can process increasing amounts of data at higher speeds, while consuming less power, may be needed. Synchronous DRAMs (SDRAMs) and Rambus DRAMs (RDRAMs) have been developed for high speed memory applications and operate in synchronization with a system clock signal. Typically, the system clock signal is received via a pin and distributed to the entire device. A clock signal that reaches a region of the device more distant from the input pin may be significantly delayed with respect to another clock signal that is closer to the input pin. This delay may make it difficult to maintain synchronism between regions within a SDRAM or a RDRAM. As a result, a delay locked loop or a phase locked loop may be used to synchronize clock signals in a device. For example, an internal clock signal may be generated to allow sampling in the middle of a valid data window to facilitate data reception, or to synchronize data to be transmitted with an edge of an external clock signal, which is sent to a memory controller to improve data transmission.

High integration of circuits within an integrated circuit memory device may increase the failure rate of components, such as transistors, which may deteriorate yield and reliability. Detecting defective chips and investigating the causes for failure at an early stage may reduce the deterioration in the yield and reliability of integrated circuit memory devices. A burn-in test is one method of detecting defective chips at an early stage. In a typical burn-in test, a high voltage, such as a prescribed maximum operating power supply voltage, is applied to a chip for a long period of time at a high temperature. In accordance with a conventional burn-in test, the stress applied to each component of a chip may be increased so that a defective chip may be more readily detected at an early stage.

A delay locked loop (DLL) is an internal circuit that typically operates at a high frequency of about 200 to 400 MHz during normal active operation. During burn-in testing, however, a clock frequency provided to a DLL by test equipment may be about 500 kHz to 1 MHz. High frequency burn-in test equipment is, therefore, preferred because low frequency burn-in test equipment may not allow the DLL circuit to operate normally. As a result, a proper evaluation of the DLL circuit may not be attained using such log frequency test equipment for burn-in test. U.S. Pat. No. 5,675,274 to Kobayashi et al. discloses a semiconductor clock signal generation circuit for testing a delay line loop (DLL) circuit when a large scale integration (LSI) circuit operates at a lower speed during burn-in testing than it does during normal operation. The approach to burn-in testing disclosed in the Kobayashi et al. patent is based on allowing the DLL circuit to perform the same operations at low speed during burn-in testing as it would under normal, high-speed operating conditions. Accordingly, there exists a need for improved integrated circuit devices and methods of operating same in which DLL circuits may be burn-in tested at higher frequencies that are closer to the circuits' normal operating frequencies.

SUMMARY OF THE INVENTION

Embodiments of the present invention may include integrated circuit devices and methods of operating same that include a delayed locked loop (DLL) circuit that can be operated at a high frequency during a normal operation mode and during a test mode. The test mode may be, for example, for performing burn-in testing. For example, an integrated circuit device may include a DLL control circuit that generates a control signal that is responsive to a test mode signal. An oscillator circuit may generate a clock signal that is responsive to the test mode signal. This clock signal may be a high frequency clock signal, such as that used to drive a DLL circuit during a normal operation mode. A DLL circuit, which is responsive to the clock signal, may be configured to operate in either a test mode or a normal operation mode based on the control signal. Advantageously, by generating the clock signal at a high frequency, the DLL circuit may be evaluated during burn-in testing, for example, under conditions that are comparable to conditions during normal operation.

The clock signal may be connected to the DLL circuit by either a fuse or a switch. The fuse or switch may be opened upon completion of testing to isolate the DLL circuit from the test circuitry. By using a switch, additional testing of the DLL circuit may be subsequently performed by moving the switch to a closed position.

The DLL control circuit may include a control signal generation circuit, which is responsive to the test mode signal and generates an enable signal, and a control signal driving circuit, which is responsive to the enable signal and generates the control signal. The control signal generation circuit may include a fuse circuit that is responsive to a transition of a power up signal and generates a logic value at an output terminal based on a state of a fuse contained therein. A latch may be used, which is responsive to the transition of the power up signal, to latch the logic value at an output terminal thereof. Finally, an output logic circuit may generate the enable signal based on the states of the logic value and the test mode signal. Thus, a fuse in the control signal generation circuit may be used to program the DLL control circuit into a test mode or a normal operation mode.

In accordance with other embodiments of the present invention, an integrated circuit device may include a first selection circuit, which selects either an internal clock signal or a feedback signal in response to a test mode signal, and a second selection circuit, which selects either a reference clock signal or a first external clock signal in response to the test mode signal. A phase detector circuit may generate a phase comparison signal that is indicative of a phase difference between the signals selected by the first and second selection circuits. Finally, a synchronization circuit may adjust a phase of the internal clock signal based on the phase comparison signal. A third selection circuit may also be used to select either the first external clock signal or a second external clock signal. The synchronization circuit may be responsive to the selected first or second external clock signal. Thus, by implementing the feedback signal and the reference clock signals as high frequency signals, the synchronization circuit may be evaluated during testing under conditions that are comparable to conditions during normal operation.

A clock generation circuit, which is responsive to a system clock signal, may be used to generate the second external clock signal, the feedback signal, and the reference signal. The clock generation circuit may include a control clock generation circuit, which is responsive to the system clock signal and generates a control clock signal, a second external clock generation circuit, which is responsive to the control clock signal and generates the second external clock signal, and a phase control circuit, which is responsive to the control clock signal and generates the feedback signal and the reference clock signal.

Thus, the present invention may allow a DLL circuit or synchronization circuit to be stressed during burn-in testing, for example, in accordance with normal (i e., high frequency) operating conditions.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
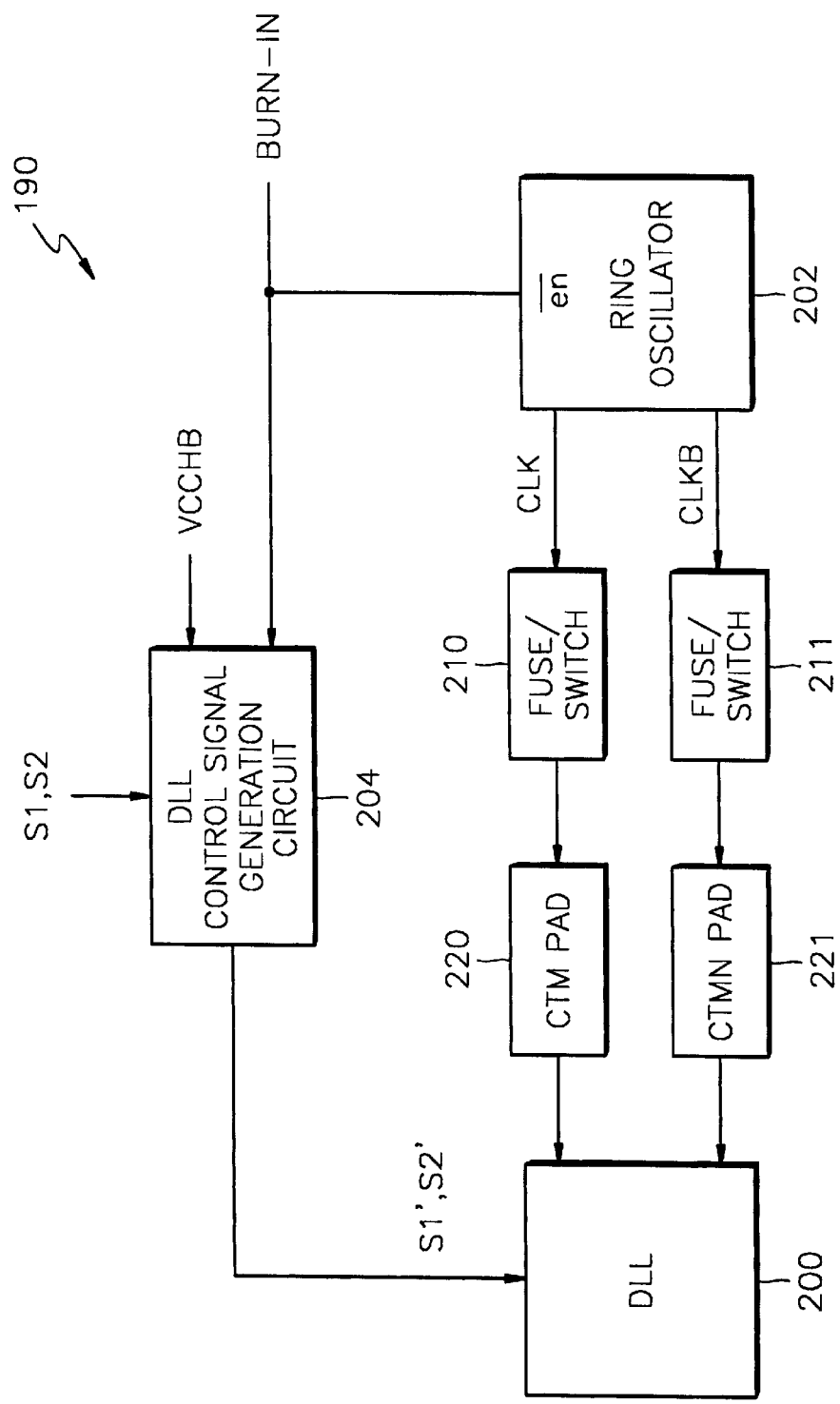
FIG. 1 is a block diagram that illustrates integrated circuit devices having a delay locked loop (DLL) circuit in accordance with first embodiments of the present invention.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like numbers refer to like elements throughout the description of the figures.

The present invention is described hereafter in the context of a Rambus DRAM (RDRAM), which contains a delay locked loop (DLL) circuit. Embodiments of the DLL circuit may be used to synchronize an internal clock signal with a clock-to-master signal (CTM) and/or a clock-from-master signal (CFM), which are clock signals that may be used in the interaction of a RDRAM with a memory controller. Nevertheless, it should be understood that the present invention is not limited to RDRAM applications or embodiments. Indeed, the present invention may be used in other integrated circuit devices, including alternative memory devices. Furthermore, he present invention is described in the context of configuring an integrated circuit device for operation in either a normal operation mode or a burn-in test mode. It will be understood that the principles and concepts of the present invention are not limited to burn-in testing, but may be applied to alternative test scenarios or even non-test scenarios.

FIG. 1 is a block diagram that illustrates an integrated circuit device 190 having a DLL circuit in accordance with first embodiments of the present invention. It will be understood that, in accordance with the present invention, the integrated circuit device 190 may include other circuits, such as circuits found in conventional integrated circuit memory devices, which are not shown. As shown in FIG. 1, a ring oscillator circuit 202 is enabled by a burn-in mode signal BURN-IN. Output clock signals CLK and CLKB, which are generated by the ring oscillator 202, are transmitted to clock pads 220 and 221 via fuse/switch blocks 210 and 211. As shown in FIG. 1, the clock pads 220 and 221 are connected to a DLL circuit 200.

In accordance with embodiments of the present invention, a CTM pad and a CTMN pad may be used as the clock pads 220 and 221. The CTM pad 220 and CTMN pad 221 receive a CTM signal and a CTMN signal, respectively, which are typically provided from an external source. A CTMN signal is obtained by inverting the phase of a CTM signal. Although differential signals comprising a CTM signal and a CTMN signal may be used in embodiments of the present invention, a CTM signal may be used instead of the differential signals. The DLL 200 receives the CTM signal and the CTMN signal to generate an internal clock signal (not shown), which is used to operate internal circuit blocks. The DLL circuit 200 may be embodied as a conventional delay locked loop circuit.

Figure 2:
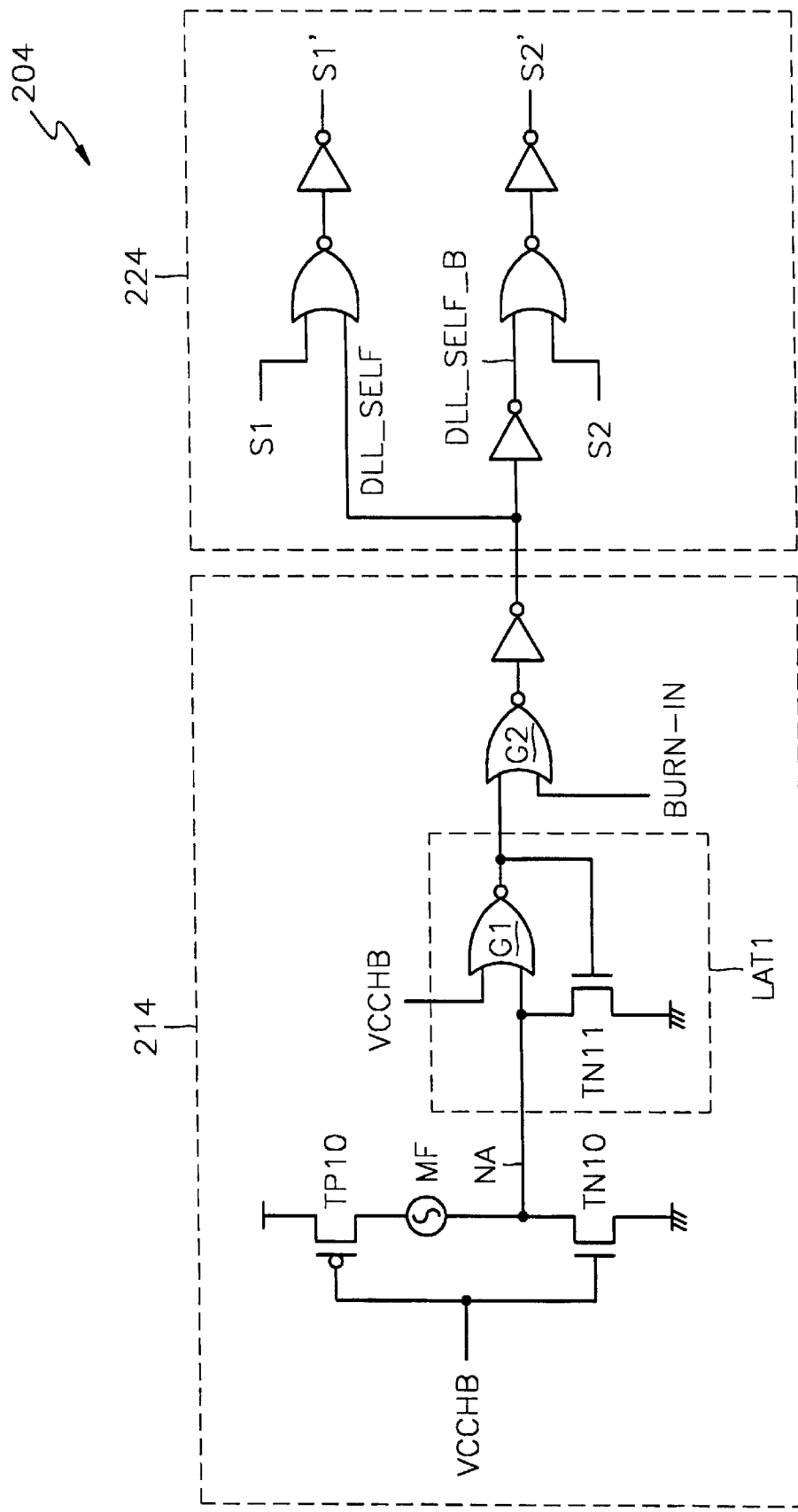
FIG. 2 is a block diagram that illustrates a DLL control circuit of FIG. 1 in accordance with embodiments of the present invention.

Signals S1' and S2' for controlling the DLL circuit 200 are provided from a DLL control signal generation circuit 204. The DLL control signal generation circuit 204 generates the DLL control signals S1' and S2' in response to a power up signal VCCHB, a burn-in test mode signal BURN-IN, and signals S1 and S2, which are provided from a logic circuit (not shown) to drive the DLL circuit 200. Embodiments of the DLL control signal generation circuit 204 are illustrated in FIG. 2. Referring now to FIG. 2, the DLL control signal generation circuit 204, in accordance with embodiments of the present invention, includes a self DLL enable signal generation unit 214 and a DLL control signal driving unit 224. The self DLL enable signal generation unit 214 generates a self DLL enable signal DLL_SELF at a logic 0 level in response to an initial logic 1 level of the power up signal VCCHB and a logic 0 level of the burn-in test mode signal BURN-IN, which corresponds to deactivation of the burn-in test mode. The self DLL enable signal DLL_SELF is provided to the DLL control signal driving unit 224 at a logic 0 level. As a result, the signals S1 and S2, which are provided from a logic circuit (not shown), are output as the DLL circuit 200 control signals S1' and S2'. This may allow the DLL circuit 200 of FIG. 1 to operate in a normal operation mode consistent with the deactivation of the burn-in mode signal BURN-IN.

When the burn-in test mode signal BURN-IN is driven to a logic 1 level (ie., activation of the burn-in test mode), the self DLL enable signal DLL_SELF is driven to a logic 1 level by the self DLL enable signal generation unit 214. In response, the DLL control signal driving unit 224 drives the DLL circuit 200 control signals S1' and S2' to a logic 1 level. This may allow the DLL circuit 200 to operate in a burn-in test mode.

In accordance with alternative embodiments of the self DLL enable signal generation unit 214, the self DLL enable signal DLL_SELF may be driven to a logic 1 level by opening a fuse MF. Specifically, when the fuse MF is opened, a transistor TN10 is turned on by the initial logic 1 level of the power up signal VCCHB, which drives a node NA to a logic 0 level. Thereafter, the transistor TN10 is turned off when the power up signal VCCHB returns to a logic 0 level, which turns on transistor TP10. At this time, the node NA is not pulled up to the power supply voltage VCC level through the transistor TP10 because the fuse MF creates an open circuit, thereby allowing the node NA to be maintained at a logic 0 level. Accordingly, the output of a NOR gate G1 is driven to a logic 1 level by a latch circuit LAT1, which comprises the NOR gate G1 and a transistor TN11. The logic 1 level that is output from the NOR gate G1 drives the self DLL enable signal DLL_SELF to a logic 1 level.

Referring again to FIG. 1, the DLL circuit 200 drives the control signals S1' and S2' are driven to logic 1 levels in response to activation of the burn-in test mode signal BURN-IN (i.e., driving the burn-in mode signal BURN-IN to a logic 1 level) and/or by opening the fuse MF. The burn-in test mode signal BURN-IN is also applied to an enable signal EN of the ring oscillator 202. Accordingly, activation of the burn-in mode signal BURN-IN initiates operation of the ring oscillator 202. Preferably, the ring oscillator 202 is configured to operate using a 6V power supply voltage, which may be used during burn-in testing rather than a conventional power supply voltage, e.g., 5V, typically used by integrated circuit devices during normal operation. Furthermore, the ring oscillator 202 preferably generates each of the clock signals CLK and CLKB at a frequency of 100 MHz or greater. The ring oscillator 202 may be embodied as a typical inverter chain.

The output clock signals CLK and CLKB of the ring oscillator 202 are connected to the DLL circuit 200 via the fuses/switches 210 and 211, and the CTM pad 220 and the CTMN pad 221, respectively. The DLL circuit 200 may be operated at high frequency during burn-in test mode in response to the control signals S1' and S2' and the high frequency output clock signals CLK and CLKB, which are generated by the ring oscillator 202. The fuses/switches 210 and 211 and the CTM pad 220/CTMN pad 221 form a conductive path.

When evaluation of the DLL circuit 200 during burn-in testing is complete, the fuses/switches 210 and 211 may be cut/opened to disconnect the DLL circuit 200 from the ring oscillator 202, inasmuch as the connection of the DLL circuit 200 to the ring oscillator 202 is unnecessary during normal operation. Note that blocks 210 and 211 may be embodied as fuses or switches. One benefit to using switches is that a burn-in test may be performed multiple times. By contrast, once fuses are opened, subsequent burn-in tests may be impossible.

Advantageously, in accordance with embodiments of the present invention, a DLL circuit 200 may be evaluated by operating the DLL circuit 200 at high frequency burn-in testing.

Figure 3:
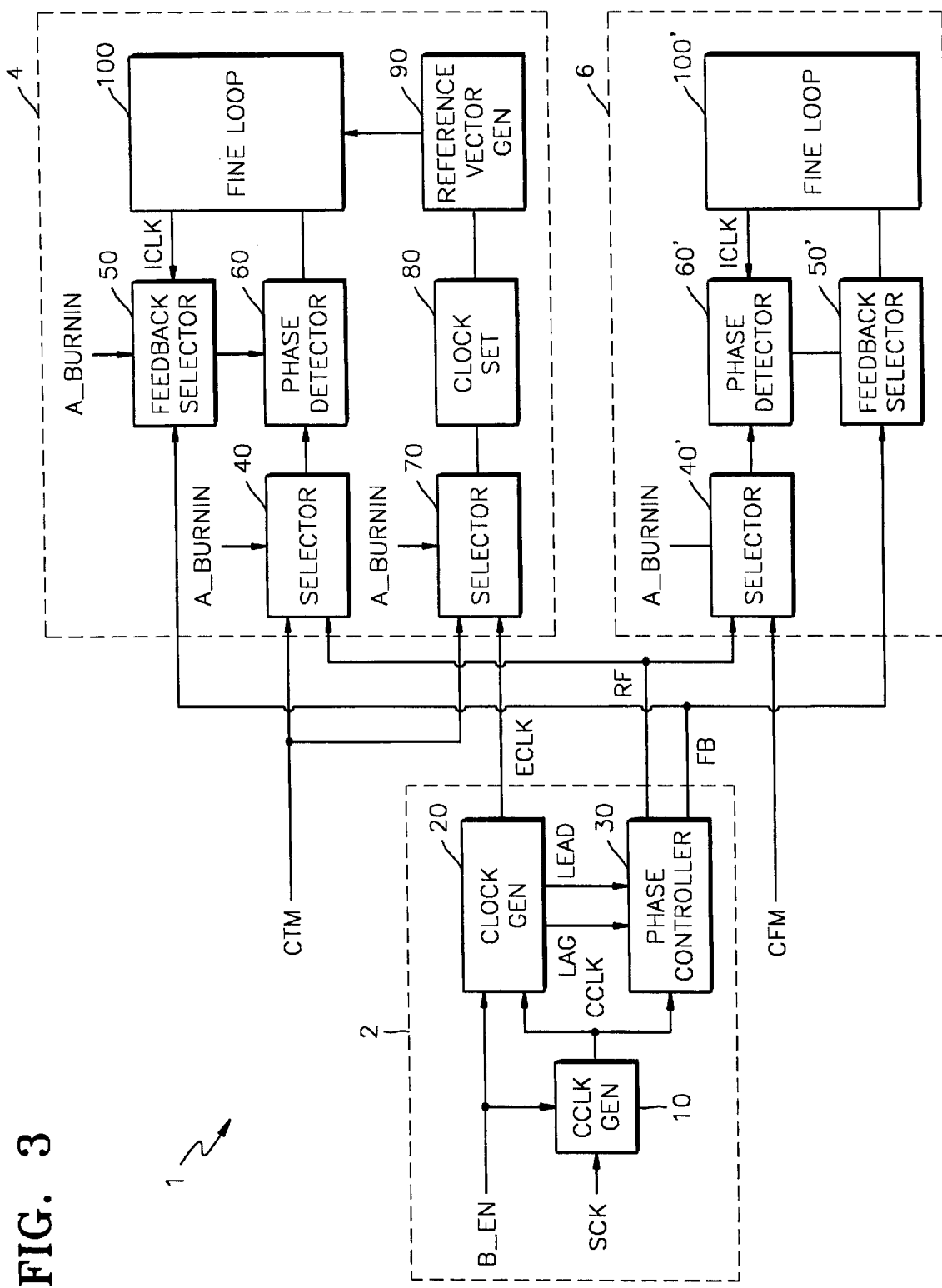
FIG. 3 is a block diagram that illustrates integrated circuit devices having a delay looked loop (DLL) circuit in accordance with other embodiments of the present invention.

FIG. 3 is a block diagram that illustrates integrated circuit devices having a DLL circuit in accordance with further embodiments of the present invention. It will be understood that, in accordance with the present invention, the integrated circuit device 1 may include other circuits, such as circuits found in conventional integrated circuit memory devices, which are not shown. As shown in FIG. 3, an integrated circuit device 1 includes a clock generation unit 2, which generates a high frequency clock signal during a burn-in test. The clock generation unit 2 includes first and second clock signal generation circuits 10 and 20 and a phase controller circuit 30. The first clock signal generation circuit 10 generates a control clock signal CCLK in response to a system clock signal SCK and a ring oscillation driving signal B_EN. The second clock signal generation circuit 20 generates an external clock signal ECLK, a lag signal LAG, and a lead signal LEAD in response to the ring oscillation driving signal B_EN and the control clock signal CCLK. The phase controller circuit 30 generates a feedback clock signal FB and a reference clock signal RF in response to the control clock signal CCLK, the lag signal LAG, and the lead signal LEAD.

The CTM DLL circuit 4 synchronizes an external clock signal, for example, a clock-to-master signal CTM or the external clock signal ECLK, with an internal clock signal ICLK. The CTM DLL circuit 4 may include a first selector circuit 40 that selects either the clock-to-master signal CTM or the reference clock signal RF in response to a burn-in mode signal A_BURNIN. A second selector circuit 70 may select either the clock-to-master signal CTM or the external clock signal ECLK in response to the burn-in mode signal A_BURNIN. A feedback selector circuit 50 may select either the feedback clock signal FB or the internal clock signal ICLK in response to the burn-in mode signal A_BURNIN. A phase comparator circuit 60 phase-compares the output of the first selector circuit 40 with the output of the feedback selector circuit 50. A clock duty setting unit 80 sets the duty cycle of the output clock signal of the second selector circuit 70. A reference vector generator 90 generates a predetermined number of reference vectors (e.g., eight reference vectors) using the output of the clock duty setting unit 80. A fine loop circuit 100 synchronizes the internal clock signal ICLK with the clock-to-master signal CTM, during normal operation, by adjusting the phase of the internal clock signal ICLK in accordance with the value of the output of the phase comparator circuit 60.

The CFM DLL circuit 6 synchronizes the phase of the internal clock signal ICLK with the phase of another external clock signal, such as the clock-from-master signal CFM. The CFM delay locked loop 6 includes a selector circuit 40', a feedback selector circuit 50', a phase detector circuit 60', and the fine loop circuit 100'. The CFM DLL circuit 6 operates similarly to the CTM DLL circuit 4. Therefore, for ease of illustration, only operations of the CTM DLL circuit 4 will be described in detail hereinafter.

Figure 4:
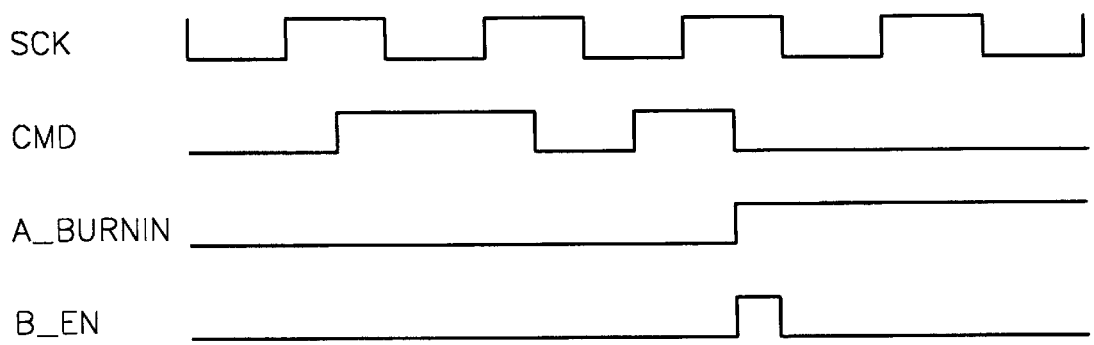
FIG. 4 illustrates exemplary signal timing diagrams for the integrated circuit devices of FIG. 3.

In accordance with the present invention, the CTM DLL circuit 4 may operate at high frequency in both a normal operation mode and in a burn-in test mode. An exemplary signal timing diagram for placing the CTM DLL circuit 4 into a burn-in test mode is illustrated in FIG. 4. A command signal CMD may be read from or written to control registers within a RDRAM in synchronization with a serial clock signal SCK. Thereafter, a burn-in test mode signal A_BURNIN is activated (i.e., driven to a logic 1 level), and the ring oscillation driving signal B_EN is activated (i. e., driven to a logic 1 level) as a pulse having a predetermined width.

Figure 5:
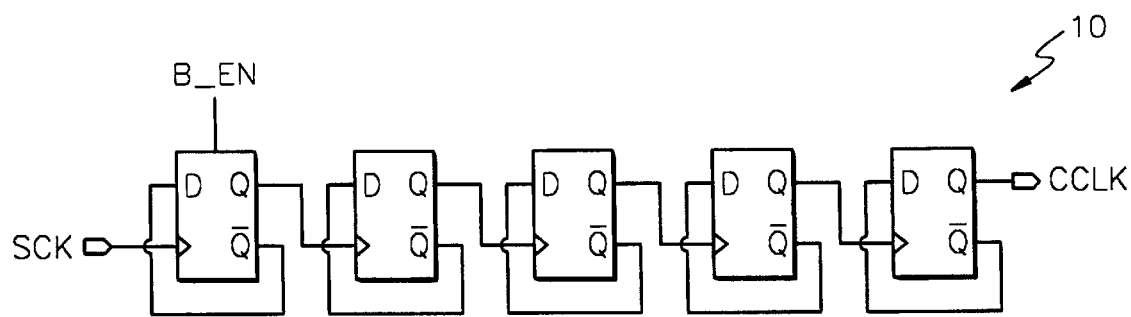
FIG. 5 illustrates a control clock generation circuit of FIG. 3 in accordance with, embodiments of the present invention.
Figure 9:
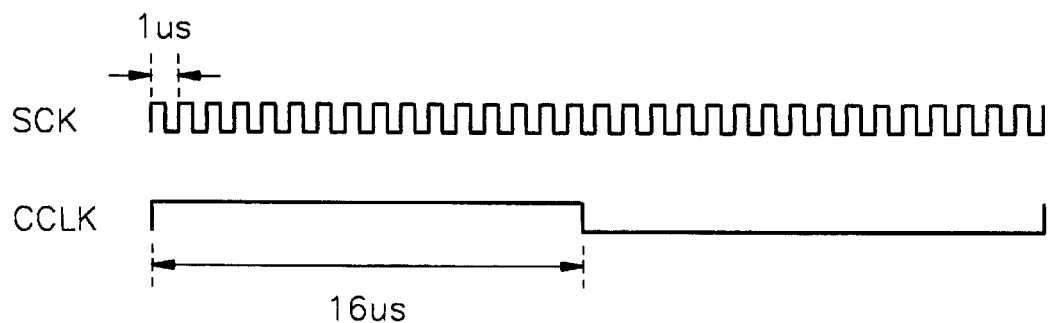
FIG. 9 illustrates signal timing diagrams associated with the control clock generation circuit of FIG. 5 in accordance with embodiments of the present invention.

Referring now to FIGS. 5 and 9, the first clock signal generation circuit 10 may include a plurality of type-D flip flops connected in series, which generate a control clock signal CCLK having a 32 μs period. The type-D flip flops are responsive to the system clock signal SCK, which has a 1 μs period, and the ring oscillation driving signal B_EN, as shown in FIG. 5. The half period (16 μs) denotes a time allocated to a counter within the fine loop circuit 100 to count up to its maximum value. For example, in the case of a 6-bit counter, the time required to count from 000000 to 111111.

Figure 6:
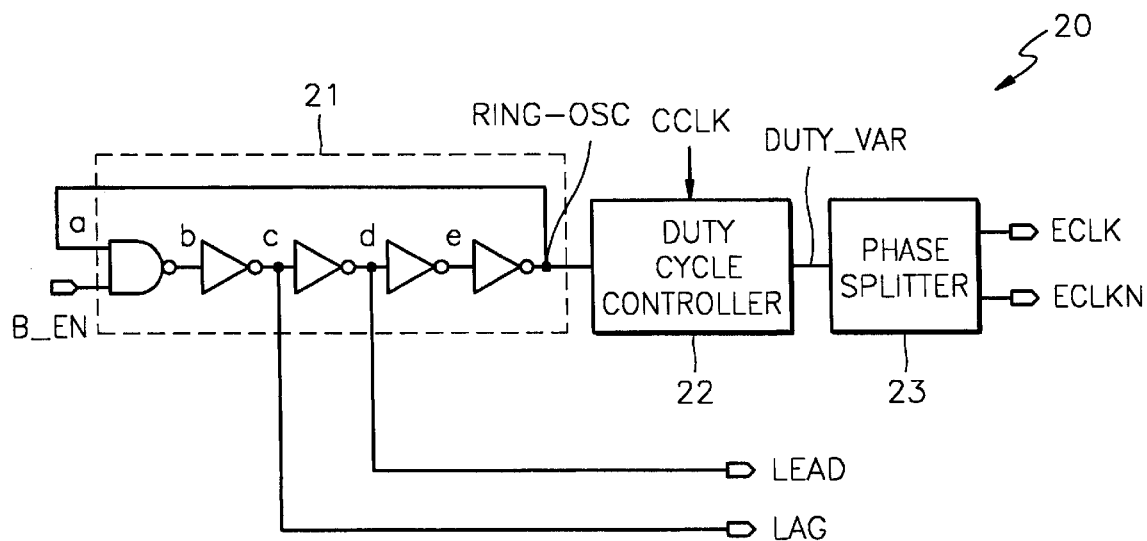
FIG. 6 illustrates an external clock signal generation circuit of FIG. 3 in accordance with embodiments of the present invention.
Figure 10:
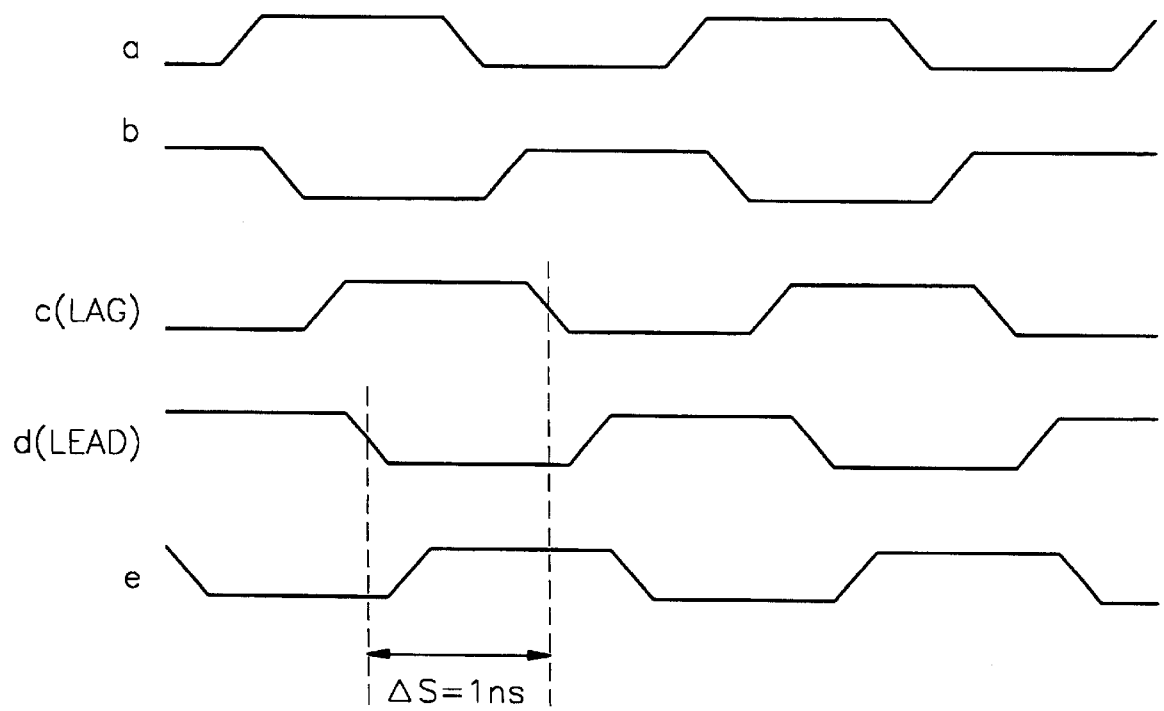
FIG. 10 illustrates signal timing diagrams associated with the external clock signal generation circuit of FIG. 6 in accordance with embodiments of the present invention.

Referring now to FIG. 6, the second clock signal generation circuit 20 may include a ring oscillation unit 21, which is responsive to the ring oscillation driving signal BEEN, a duty cycle controller circuit 22, which is responsive to the control clock signal CCLK and varies the duty cycle of the output signal RING-OSC of the ring oscillation unit 21, and a phase splitter circuit 23 that receives a duty variation signal DUTY_VAR, which is the output of the duty cycle controller 22, and generates the external clock signal ECLK, which may be split into two clock signals having a complemented phase difference. The waveforms of the internal outputs a, b, c, d, and e of the ring oscillation unit 21 may have a frequency of about 400 MHz as shown in the waveform diagrams of FIG. 10. The delay difference between the lag signal LAG and the lead signal LEAD may be set to about 1ns.

Figure 7:
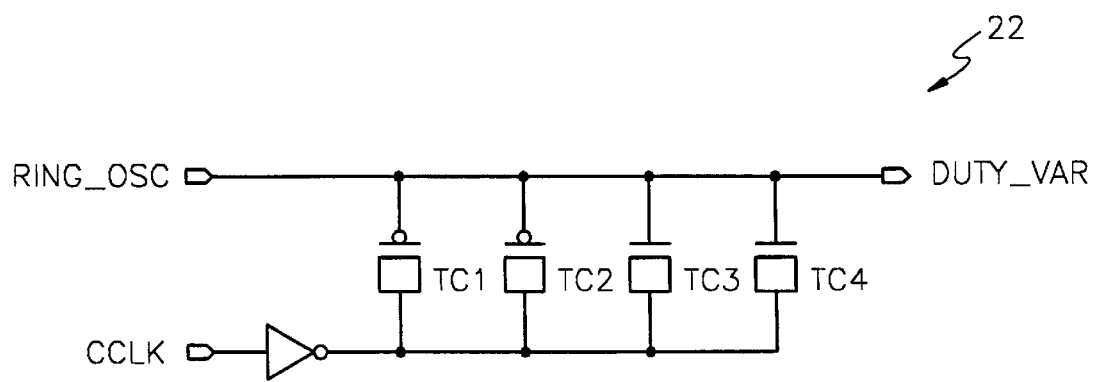
FIG. 7 illustrates a duty cycle control circuit of FIG. 6 in accordance with embodiments of the present invention.

Referring now to FIG. 7, the duty cycle controller 22 may include a plurality of capacitors TC1, TC2, TC3 and TC4 connected in parallel between the output of the ring oscillation unit 21 (i.e., the RING_OSC signal) and the inverted control clock signal CCLK. Each one of the plurality of capacitors TC1, TC2, TC3, and TC4 may comprise a plurality of transistors. The control clock signal CCLK signal may be configured to alternate between a logic 0 level for a duration of 16 μs and a logic 1 level for a duration of 16 μs. While the control clock signal CCLK is at a logic 1 level, the logic 1 level of the RING_OSC signal is output as the duty variation signal DUTY_VAR while charging the capacitors TC3 and TC4. While the first clock signal CCLK is a logic 0 level, the logic 0 level of the RING_OSC signal is output as the duty variation signal DUTY_VAR while charging the capacitors TC1 and TC2.

Figure 8:
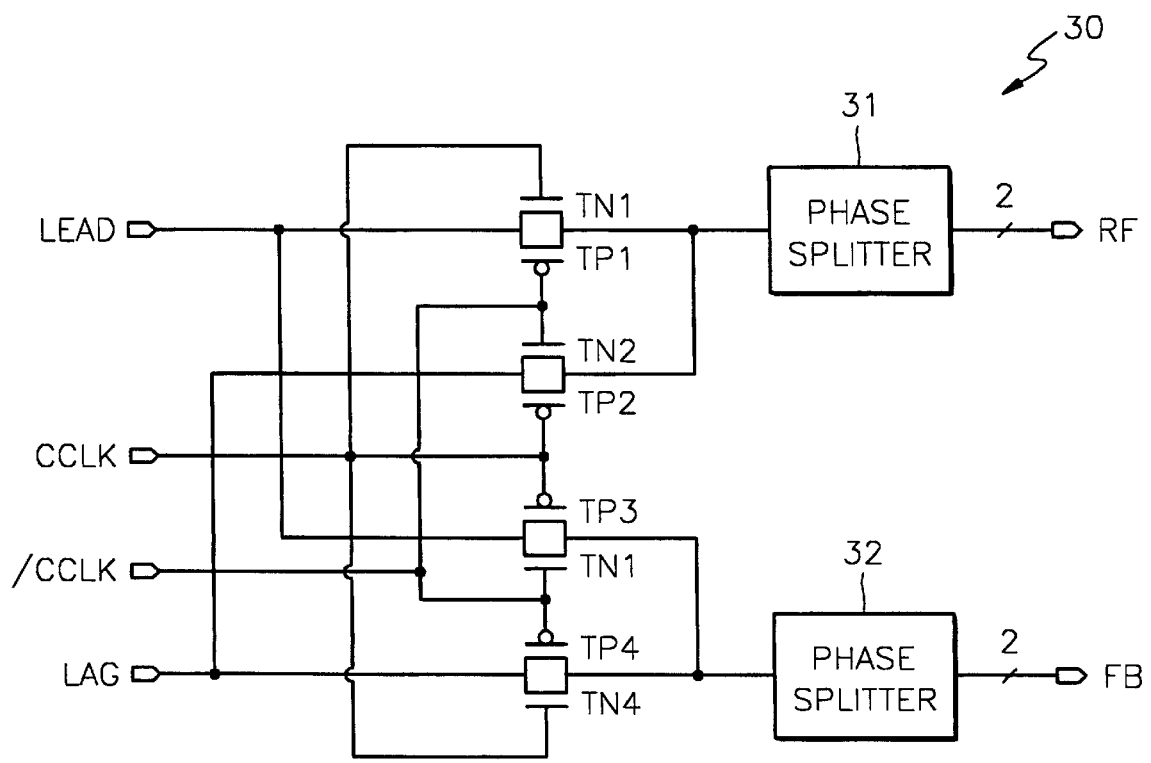
FIG. 8 illustrates a phase control circuit of FIG. 3 in accordance with embodiments of the present invention.

Referring now to FIG. 8, the phase controller circuit 30 generates the feedback clock signal FB and the reference clock signal RF in response to the control clock signal CCLK, the lag signal LAG, and the lead signal LEAD. Specifically, in response to a logic 1 level of the control clock signal CCLK, the transmission gate TG1 is turned on to thereby transmit the lead signal LEAD to the phase splitter circuit 31, which outputs the lead signal LEAD as the reference clock signal RF. Furthermore, in response to a logic 1 level of the control clock signal CCLK, the transmission gate TG4 is turned on to thereby transmit the lag signal LAG to the phase splitter circuit 32, which outputs the lag signal LAG as the feedback clock signal FB. In accordance with embodiments of the present invention, the lead signal LEAD may lead the lag signal LAG by 1 ns as shown in the timing diagram of FIG. 10. Thus, when the control clock signal CCLK is at a logic 1 level, the reference clock signal RF leads the feedback clock signal FB.

In response to a logic 0 level of the control clock signal CCLK, the transmission gate TG3 is turned on to thereby transmit the lead signal LEAD to the phase splitter circuit 32, which outputs the lead signal LEAD as the feedback clock signal FB. Furthermore, in response to a logic 0 level of the control clock signal CCLK, the transmission gate TG2 is turned on to thereby transmit the lag signal LAG to the phase splitter circuit 31, which outputs the lag signal LAG as the reference clock signal RF. Thus, when the control clock signal CCLK is at a logic 0 level, the reference clock signal RF lags the feedback clock signal FB.

Operations of integrated circuit devices in accordance with embodiments of the present invention illustrated in FIG. 3 will be described hereafter. During burn-in testing, the burn-in mode signal A_BURNIN is driven to a logic 1 level, which allows the second selector circuit 70 to select the external clock signal ECLK. The external clock signal ECLK is then duty-set by the clock duty setting unit 80. A cycle of the external clock signal ECLK is divided into eight reference vectors by the reference vector generator 90, and then the resultant signal is output to the fine loop circuit 100. The first selector circuit 40 selects the reference clock signal RF and the feedback selector circuit 50 selects the feedback clock signal FB in response to the burn-in mode signal A_BURNIN being driven to a logic 1 level. Thus, the reference clock signal RF and the feedback clock signal FB are provided as inputs to the phase detector circuit 60. The feedback clock signal FB and the reference clock signal RF are phase-compared by the phase detector 60 and the resultant signal is transmitted to the fine loop circuit 100. Advantageously, the feedback clock signal FB and the reference clock signal RF may be high frequency clock signals generated by the ring oscillation unit 21 as discussed hereinabove with respect to FIGS. 6 and 7.

The CTM DLL circuit 4 may, therefore, operate normally, i.e., at high frequency, during burn-in mode testing. Thus, the CTM DLL circuit 4 may be stressed during burn-in testing according to conventional operating conditions. Furthermore, it will be understood that the signals received by the CTM DLL circuit 4, such as the CTM signal, the CFM signal, or the like, may have CMOS voltage levels rather than Rambus signal levels (RSL) during burn-in testing.

During normal operation of the CTM DLL circuit 4, the burn-in mode signal A_BURNIN is driven to a logic 0 level, which allows the first selector circuit 40 and the second selector circuit 70 to select the CTM signal. The CTM signal is then duty-set by the clock duty setting unit 80. A cycle of the CTM signal is divided into eight reference vectors by the reference vector generator 90, and then the resultant signal is output to the fine loop circuit 100. The feedback selector circuit 50 selects the internal clock signal ICLK in response to the burn-in mode signal A_BURNIN being driven to a logic 0 level. Thus, the CTM signal and the internal clock signal ICLK are provided as inputs to the phase detector circuit 60. The CTM signal and the internal clock signal ICLK are phase-compared by the phase detector 60 and the resultant signal is transmitted to the fine loop circuit 100. Thus, the fine loop circuit 100 may adjust a delay time using the result of the phase detector 60 to synchronize the phase of the CTM signal with the phase of the internal clock signal in accordance with a normal mode of operation.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

We claim:

1. An integrated circuit device, comprising:
   a control circuit that generates a control signal responsive to a test mode signal;
   an oscillator circuit that generates a clock signal responsive to the test mode signal; and
   a delay locked loop (DLL) circuit that is configured to operate in one of a test mode and a normal mode in response to the control signal and is further responsive to the clock signal.

2. An integrated circuit device as recited in claim 1, further comprising: a fuse that conveys the clock signal to the DLL circuit.

3. An integrated circuit device as recited in claim 1, further comprising: a switch that conveys the clock signal to the DLL circuit.

4. An integrated circuit device as recited in claim 1, wherein the control circuit comprises:
   a control signal generation circuit that is responsive to the test mode signal and generates an enable signal; and
   a control signal driving circuit that is responsive to the enable signal and generates the control signal.

5. An integrated circuit device as recited in claim 4, wherein the control signal generation circuit comprises:
   a fuse circuit that is responsive to a transition of a power up signal and generates a logic value at an output terminal thereof based on a state of a fuse contained therein;
   a latch circuit that is responsive to the transition of the power up signal, has an input terminal electrically connected to the output terminal of the fuse circuit, and that latches the logic value at an output terminal thereof; and
   an output logic circuit that is responsive to the test mode signal, has an input terminal electrically connected to the output terminal of the latch circuit, and that generates the enable signal at an output terminal thereof based on states of the logic value and the test mode signal.

6. An integrated circuit device, comprising:
   a first selection circuit that receives an internal clock signal at a first input terminal thereof and a feedback signal at a second input terminal thereof, and provides one of the internal clock signal and the feedback signal at an output terminal thereof in response to a test mode signal;
   a second selection circuit that receives a first external clock signal at a first input terminal thereof and a reference clock signal at a second input terminal thereof, and provides one of the first external clock signal and the reference clock signal at an output terminal thereof in response to the test mode signal;
   a phase detector circuit having first and second input terminals that are electrically connected to the output terminals of the first and second selection circuits, respectively, and generates a phase comparison signal at an output terminal thereof, the phase comparison signal being indicative of a phase difference between signals on the first and second input terminals of the phase detector circuit; and
   a synchronization circuit that adjusts a phase of the internal clock signal based on the phase comparison signal.

7. An integrated circuit device as recited in claim 6, further comprising:
   a third selection circuit that receives the first external clock signal at a first input terminal thereof and a second external clock signal at a second input terminal thereof, and provides one of the first and second external clock signals at an output terminal thereof in response to a test mode signal; and
   wherein the synchronization circuit is responsive to the clock signal provided at the output terminal of the third selection circuit.

8. An integrated circuit device as recited in claim 7, further comprising:
   a clock duty setting circuit having an input terminal electrically connected to the output terminal of the third selection circuit, and having an output terminal; and
   a reference vector generator circuit having an input terminal electrically connected to the output terminal of the clock duty setting circuit and having an output terminal connected to an input terminal of the synchronization circuit.

9. An integrated circuit device as recited in claim 7, further comprising:
   a clock generation circuit that is responsive to a system clock signal and generates the second external clock signal, the feedback signal, and the reference clock signal.

10. An integrated circuit device as recited in claim 9, wherein the clock generation circuit comprises:
    a control clock generation circuit that is responsive to the system clock signal and generates a control clock signal;
    a second external clock signal generation circuit that is responsive to the control clock signal and generates the second external clock signal; and
    a phase control circuit that is responsive to the control clock signal and generates the feedback signal and the reference clock signal.

11. An integrated circuit device as recited in claim 10, wherein the control clock generation circuit comprises a plurality of type-D flip flops electrically connected in series.

12. An integrated circuit device as recited in claim 10, wherein the second external clock signal generation circuit comprises:
    an oscillator circuit that generates a lead signal and a lag signal, which are out of phase with each other, and an oscillator output signal;
    a duty cycle control circuit that is responsive to the control clock signal and adjusts a duty cycle of the oscillator output signal; and
    a phase splitter circuit that is responsive to the oscillator output signal with adjusted duty cycle and generates the second external clock signal.

13. An integrated circuit device as recited in claim 12, wherein the phase control circuit comprises
    a plurality of transmission gates connected in series and being responsive to the control clock signal such that the feedback signal is generated as the lag signal and the reference clock signal is generated as the lead signal when the control clock signal is in a first state, and the feedback signal is generated as the lead signal and the reference clock signal is generated as the lag signal when the control clock signal is in a second state.

14. An integrated circuit device, comprising:

means for selecting one of an internal clock signal and a feedback signal as a first input signal in response to a test mode signal;

means for selecting one of a first external clock signal and a reference clock signal as a second input signal in response to the test mode signal;

means for generating a phase comparison signal that is indicative of a phase difference between the first and second input signals; and means for adjusting a phase of the internal clock signal based on the phase comparison signal.

15. An integrated circuit device as recited in claim 14, further comprising:

means for selecting one of the first external clock signal and a second external clock signal in response to the test mode signal;

wherein the means for adjusting a phase of the internal clock signal is responsive to the selected one of the first and second external clock signals.

16. An integrated circuit device as recited in claim 15, further comprising:

means for setting a duty cycle of the selected one of the first and second external clock signals; and means for generating reference vectors based on the selected one of the first and second external clock signals, the means for generating reference vectors being responsive to the means for setting the duty cycle.

17. A method of operating an integrated circuit device, comprising the steps of:

providing a test mode signal;

generating a control signal in response to the test mode signal;

operating an oscillator circuit in response to the test mode signal to generate a clock signal; and operating a delay locked loop (DLL) circuit in one of a test mode and a normal mode in response to the control signal and the clock signal.

18. A method of operating an integrated circuit device, comprising the steps of:

selecting one of an internal clock signal and a feedback signal as a first input signal in response to a test mode signal;

selecting one of a first external clock signal and a reference clock signal as a second input signal in response to the test mode signal;

generating a phase comparison signal that is indicative of a phase difference between the first and second input signals; and adjusting a phase of the internal clock signal based on the phase comparison signal.

19. A method as recited in claim 18, further comprising the steps of:

selecting one of the first external clock signal and a second external clock signal in response to the test mode signal;

setting a duty cycle of the selected one of the first and second external clock signals; and generating reference vectors based on the selected one of the first and second external clock signals.

* * * * *